United States Patent
Saito et al.

(10) Patent No.: US 11,765,979 B2
(45) Date of Patent: Sep. 19, 2023

(54) VIBRATION DEVICE

(71) Applicant: TDK CORPORATION, Tokyo (JP)

(72) Inventors: Kazuki Saito, Tokyo (JP); Kaoru Kijima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 453 days.

(21) Appl. No.: 17/265,583

(22) PCT Filed: Aug. 8, 2019

(86) PCT No.: PCT/JP2019/031433
§ 371 (c)(1),
(2) Date: Feb. 3, 2021

(87) PCT Pub. No.: WO2020/036122
PCT Pub. Date: Feb. 20, 2020

(65) Prior Publication Data
US 2021/0343925 A1    Nov. 4, 2021

(30) Foreign Application Priority Data

Aug. 13, 2018   (JP) .............................. 2018-152401

(51) Int. Cl.
*H10N 30/88*   (2023.01)

(52) U.S. Cl.
CPC ................................ *H10N 30/883* (2023.02)

(58) Field of Classification Search
CPC .... H10N 30/883; H10N 30/87; H10N 30/302; B06B 1/06
See application file for complete search history.

(56) References Cited

U.S. PATENT DOCUMENTS

| | | | | |
|---|---|---|---|---|
| 2015/0201281 A1* | 7/2015 | Hirayama | .............. | H04R 17/00 381/162 |
| 2020/0119712 A1* | 4/2020 | Matsumoto | ........ | H03H 9/02905 |

FOREIGN PATENT DOCUMENTS

| | | | | |
|---|---|---|---|---|
| EP | 1329963 A1 * | 7/2003 | ....... | B60G 17/01941 |
| JP | H04-070100 A | 3/1992 | | |
| JP | 2022115575 A * | 8/2022 | ....... | B60G 17/01941 |

OTHER PUBLICATIONS

Feb. 16, 2021 International Preliminary Report on Patentability issued in International Patent Application No. PCT/JP2019/031433.

* cited by examiner

*Primary Examiner* — J. San Martin
(74) *Attorney, Agent, or Firm* — Oliff PLC

(57) ABSTRACT

A piezoelectric element includes a piezoelectric element body, a first external electrode disposed on a first main surface of the piezoelectric element body, and a second external electrode disposed on a second main surface of the piezoelectric element body. A vibration member includes an electrically conductive third main surface and a fourth main surface opposing the third main surface. The vibration member is disposed such that the third main surface opposes the first external electrode. A protective layer covers the piezoelectric element. The protective layer includes a first resin layer and a second resin layer. The first resin layer covers the piezoelectric element body and the second external electrode. The second resin layer is disposed between the first external electrode and the third main surface and joins the first external electrode and the third main surface. The first resin layer is smaller in hardness than the second resin layer.

7 Claims, 9 Drawing Sheets

VIBRATION DEVICE

TECHNICAL FIELD

The present invention relates to a vibration device.

BACKGROUND ART

Known piezoelectric devices include a piezoelectric element and a vibration member (see, for example, Patent Document 1). The piezoelectric element includes a piezoelectric element body, a first external electrode, and a second external electrode. The piezoelectric element body includes a first main surface and a second main surface opposing each other. The first external electrode is disposed on the first main surface. The second external electrode is disposed on the second main surface. The vibration member includes an electrically conductive third main surface and a fourth main surface opposing the third main surface. The vibration member is disposed such that the third main surface opposes the first external electrode.

CITATION LIST

Patent Literature

Patent Document 1: Japanese Unexamined Patent Publication No. H04-070100

SUMMARY OF INVENTION

Technical Problem

In the vibration device described in Patent Document 1, electrical characteristics of the piezoelectric element may deteriorate as described below. In a case where moisture infiltrates into the piezoelectric element body, a metal element that is contained in the piezoelectric ceramic material constituting the piezoelectric element body may be eluted. For example, deterioration of piezoelectric characteristics, a change in the electrical resistance or capacitance of the piezoelectric element, or short circuits of the electrodes may occur. In a case where the metal element contained in the piezoelectric ceramic material is eluted, the electrical characteristics of the piezoelectric element may deteriorate. The deterioration of the electrical characteristics of the piezoelectric element may affect vibration characteristics of the vibration device.

An object of one aspect of the present invention is to provide a vibration device that reduces deterioration of the electrical characteristics of a piezoelectric element.

Solution to Problem

A vibration device according to one aspect of the present invention includes a piezoelectric element, a vibration member, and a protective layer. The piezoelectric element includes a piezoelectric element body, a first external electrode, and a second external electrode. The piezoelectric element body includes a first main surface and a second main surface opposing each other. The first external electrode is disposed on the first main surface. The second external electrode is disposed on the second main surface. The vibration member includes an electrically conductive third main surface and a fourth main surface opposing the third main surface. The vibration member is disposed such that the third main surface opposes the first external electrode. The protective layer is disposed to cover the piezoelectric element. The first external electrode and the third main surface are electrically connected to each other. The protective layer includes a first resin layer and a second resin layer. The first resin layer is disposed to cover the piezoelectric element body and the second external electrode. The second resin layer is disposed between the first external electrode and the third main surface and joins the first external electrode and the third main surface. The first resin layer is smaller in hardness than the second resin layer.

In the one aspect, the protective layer is disposed to cover the piezoelectric element, and thus the protective layer suppresses moisture infiltration into the piezoelectric element body. Therefore, the one aspect reduces deterioration of the electrical characteristics of the piezoelectric element.

In a configuration in which the piezoelectric element is covered with the protective layer, the protective layer may hinder displacement of the piezoelectric element and the protective layer may hinder transmission of the displacement from the piezoelectric element to the vibration member.

The hardness of the first resin layer is smaller than the hardness of the second resin layer. Therefore, in the one aspect, the first resin layer tends not to hinder the displacement of the piezoelectric element, as compared with in a configuration in which the hardness of the first resin layer is equal to or greater than the hardness of the second resin layer. The hardness of the second resin layer is larger than the hardness of the first resin layer. Therefore, in the one aspect, the second resin layer tends not to hinder the transmission of the displacement from the piezoelectric element to the vibration member, as compared with in a configuration in which the hardness of the second resin layer is equal to or less than the hardness of the first resin layer. Consequently, the protective layer tends not to hinder the displacement of the piezoelectric element and tends not to hinder the transmission of the displacement from the piezoelectric element to the vibration member.

In the one aspect, a surface of the second external electrode may include a first region covered with the first resin layer and a second region exposed from the first resin layer. In this case, an electrical connection path that reaches the second external electrode is realized via the second region. Therefore, this configuration simplifies a configuration realizing the electrical connection path reaching the second external electrode.

In the one aspect, the piezoelectric element may be positioned approximately in a middle of the third main surface of the vibration member when viewed from a direction orthogonal to the second main surface. The second region may be positioned approximately in a middle of the surface of the second external electrode when viewed from the direction orthogonal to the second main surface.

The vibration device may be used in, for example, a press sensor detecting pressing against an operation surface. In a case where the vibration device is used in the press sensor, the vibration device is usually disposed such that approximately the middle of the vibration device corresponds to a pressing position on the operation surface. In this case, mainly a portion of the piezoelectric element body that corresponds to the second region is displaced and an electric potential is generated. In the configuration in which the piezoelectric element is positioned approximately in the middle of the third main surface and the second region is positioned approximately in the middle of the surface of the second external electrode when viewed from the direction orthogonal to the second main surface, the electric potential resulting from the pressing is efficiently taken out through the second region. Therefore, the vibration device appropriately detects the pressing.

In the one aspect, the second region may be positioned to be surrounded by the first region when viewed from a direction orthogonal to the second main surface. The first resin layer may be provided with a protrusion along an inner edge of the first resin layer defining the second region.

An electrically conductive paste material may be used for electrical connection between the second region and a line of an electronic device equipped with the vibration device. In this case, the paste material is applied to the second region. In the configuration in which the first resin layer is provided with the protrusion along the inner edge of the first resin layer, the paste material tends to be held in the second region, as compared with in a configuration in which the first resin layer is not provided with the protrusion along the inner edge of the first resin layer. Therefore, in this configuration, the second region is electrically connected to the line of the electronic device in a reliable manner.

In the one aspect, the first resin layer may be provided with a protrusion along an outer edge of the first resin layer at a position outside the piezoelectric element when viewed from a direction orthogonal to the second main surface. Since this configuration is provided with the protrusion, a thickness of the first resin layer at the position outside the piezoelectric element when viewed from the direction orthogonal to the second main surface is large, as compared with in a configuration in which the first resin layer is not provided with the protrusion along the outer edge of the first resin layer. Therefore, the first resin layer reliably covers the end of the piezoelectric element body and reliably suppresses moisture infiltration into the piezoelectric element body.

The configuration in which the thickness of the first resin layer is large tends to hinder the displacement of the piezoelectric element as compared with a configuration in which the thickness of the first resin layer is small. In contrast, in this configuration, the thickness of the first resin layer is large at a position outside the piezoelectric element when viewed from the direction orthogonal to the second main surface. Therefore, this configuration tends not to hinder the displacement of the piezoelectric element.

In the one aspect, the first external electrode may include a plurality of protrusions being in physical contact with the third main surface. The second resin layer may be positioned between the plurality of protrusions of the first external electrode. In this case, the plurality of protrusions of the first external electrode are electrically connected to the third main surface by physical contact with the third main surface. Therefore, in this configuration, an electrical connection path that reaches the first external electrode is realized via the third main surface and the plurality of protrusions. The first external electrode and the third main surface are joined by the second resin layer provided between the plurality of protrusions. Therefore, this configuration ensures bonding strength between the vibration member and the piezoelectric element.

In the one aspect, the second resin layer may include an outside region positioned outside the piezoelectric element when viewed from a direction orthogonal to the second main surface. The first resin layer may be provided to overlap the outside region of the second resin layer when viewed from the direction orthogonal to the second main surface and in contact with the outside region of the second resin layer. In this case, the piezoelectric element is reliably covered with the first resin layer and the second resin layer. Therefore, the first resin layer and the second resin layer reliably suppress moisture infiltration into the piezoelectric element body.

Advantageous Effects of Invention

One aspect of the present invention provides the vibration device that reduces deterioration of the electrical characteristics of a piezoelectric element.

DESCRIPTION OF EMBODIMENTS

Figure 1:
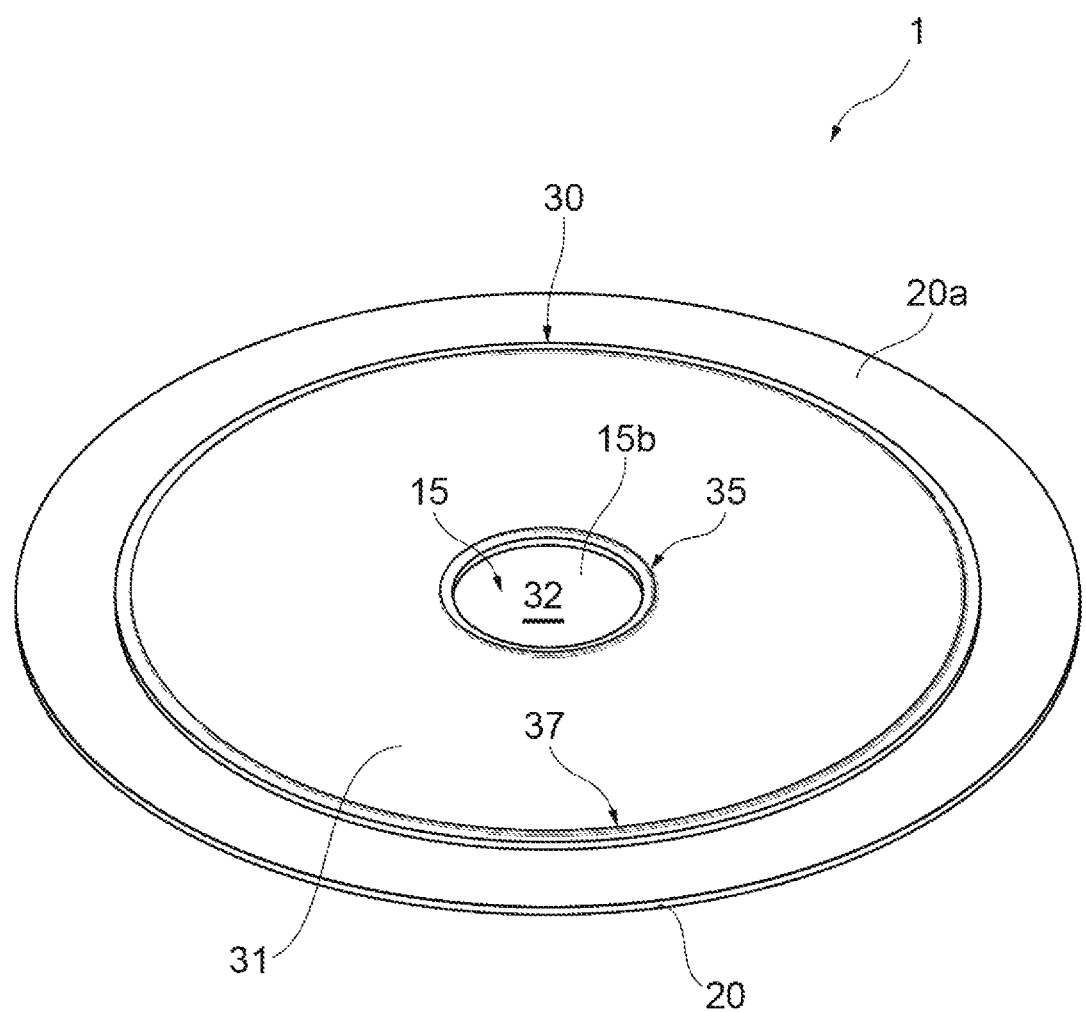
FIG. 1 is a perspective view illustrating the vibration device according to an embodiment.

Hereinafter, an embodiment of the present invention will be described in detail with reference to the accompanying drawings. In the description, the same reference numerals are used for the same elements or elements having the same functions with redundant description omitted.

Figure 2:
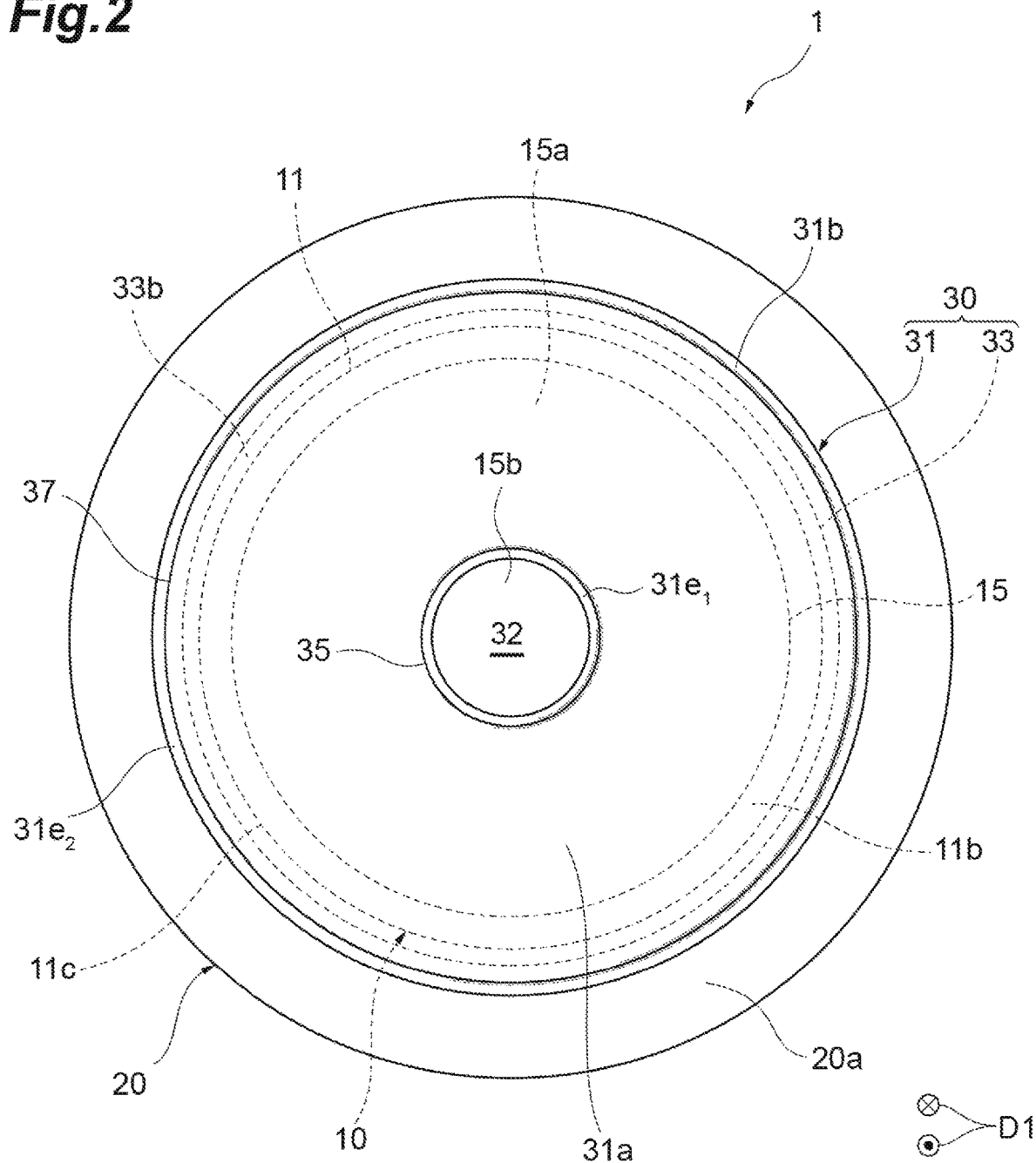
FIG. 2 is a plan view illustrating the vibration device according to the present embodiment.

A configuration of a vibration device 1 according to the present embodiment will be described with reference to FIGS. 1 to 6. FIG. 1 is a perspective view illustrating the vibration device according to the present embodiment. FIG. 2 is a plan view illustrating the vibration device according to the present embodiment. FIGS. 3, 4, 5, and 6 are diagrams illustrating a cross-sectional configuration of the vibration device according to the present embodiment.

As illustrated in FIGS. 1 to 4, the vibration device 1 includes a piezoelectric element 10, a vibration member 20, and a protective layer 30. The piezoelectric element 10 includes a piezoelectric element body 11 and a pair of external electrodes 13 and 15. In the present embodiment, the piezoelectric element 10 does not include an internal electrode disposed in the piezoelectric element body 11.

The piezoelectric element body 11 has a circular disk shape. The piezoelectric element body 11 includes a pair of main surfaces 11a and 11b opposing each other and a side surface 11c. The shape and area of the main surface 11a and the shape and area of the main surface 11b are approximately the same. The main surfaces 11a and 11b are circular. In the present embodiment, each of the main surfaces 11a and 11b has a substantially perfect circular shape. The main surface 11b constitutes a second main surface in a case where, for example, the main surface 11a constitutes a first main surface.

A direction in which the main surface 11a and the main surface 11b oppose each other is a first direction D1. The first direction D1 is orthogonal to the main surfaces 11a and 11b. The side surface 11c extends in the first direction D1 to couple the main surface 11a and the main surface 11b. The main surfaces 11a and 11b and the side surface 11c are indirectly adjacent to each other via a ridge line portion. A length of the piezoelectric element body 11 in the first direction D1, that is, a thickness of the piezoelectric element body 11 is, for example, 60 to 200 μm. In the present embodiment, the thickness of the piezoelectric element body 11 is 150 μm.

The piezoelectric element body 11 is made of a piezoelectric material. In the present embodiment, the piezoelectric element body 11 is made of a piezoelectric ceramic material. The piezoelectric ceramic material is, for example, PZT [Pb (Zr, Ti) $O_3$], PT ($PbTiO_3$), PLZT [(Pb, La)(Zr, Ti) $O_3$], or barium titanate ($BaTiO_3$). The piezoelectric element body 11 is configured as, for example, a sintered body of a ceramic green sheet containing the above-described piezoelectric ceramic material.

The external electrode 13 is disposed on the main surface 11a. The external electrode 13 is in contact with the main surface 11a. The external electrode 15 is disposed on the main surface 11b. The external electrode 15 is in contact with the main surface 11b. Each of the external electrodes 13 and 15 is circular when viewed from the first direction D1. A surface of each of the external electrodes 13 and 15 is circular. In the present embodiment, each of the external electrodes 13 and 15 (the surface of each of the external electrodes 13 and 15) has a substantially perfect circular shape. Each of the external electrodes 13 and 15 is made of an electrically conductive material. The electrically conductive material is, for example, Ag, Pd, or Ag—Pd alloy. Each of the external electrodes 13 and 15 is configured as a sintered body of electrically conductive paste containing the electrically conductive material. No electrode is disposed on the side surface 11c of the piezoelectric element body 11. Therefore, the entire side surface 11c is exposed from the external electrodes 13 and 15 without being covered with the electrodes. The external electrode 15 constitutes a second external electrode in a case where, for example, the external electrode 13 constitutes a first external electrode.

The external electrode 13 covers a part of the main surface 11a. An area of the external electrode 13 is smaller than the area of the main surface 11a when viewed from the first direction D1. The external electrode 13 is positioned inside an end edge of the main surface 11a when viewed from the first direction D1. The external electrode 13 is separated from the end edge of the main surface 11a. The main surface 11a has a region covered with the external electrode 13 and a region exposed from the external electrode 13. The region covered with the external electrode 13 is positioned inside the region exposed from the external electrode 13 and is surrounded by the region exposed from the external electrode 13 when viewed from the first direction D1. The external electrode 13 may cover the entire main surface 11a.

The external electrode 15 covers a part of the main surface 11b. An area of the external electrode 15 is smaller than the area of the main surface 11b when viewed from the first direction D1. The external electrode 15 is positioned inside an end edge of the main surface 11b when viewed from the first direction D1. The external electrode 15 is separated from the end edge of the main surface 11b. The main surface 11b has a region covered with the external electrode 15 and a region exposed from the external electrode 15. The region covered with the external electrode 15 is positioned inside the region exposed from the external electrode 15 and is surrounded by the region exposed from the external electrode 15 when viewed from the first direction D1. The external electrode 15 may cover the entire main surface 11b.

The vibration member 20 includes a pair of main surfaces 20a and 20b opposing each other. A direction in which the main surface 20a and the main surface 20b oppose each other is also the first direction D1. The first direction D1 is also orthogonal to the main surfaces 20a and 20b. The vibration member 20 is a plate-shaped member. In the present embodiment, the vibration member 20 is a vibration plate. The vibration member 20 is made of, for example, metal. The vibration member 20 is made of, for example, Ni—Fe alloy, Ni, brass, or stainless steel. The vibration member 20 has electrical conductivity. Therefore, the main surfaces 20a and 20b also have electrical conductivity. The vibration member 20 (main surfaces 20a and 20b) is circular when viewed from the first direction D1. In the present embodiment, the vibration member 20 (main surfaces 20a and 20b) has a substantially perfect circular shape. A length of the vibration member 20 in the first direction D1, that is, a thickness of the vibration member 20 is, for example, 100 to 150 μm. In the present embodiment, the thickness of the vibration member 20 is 120 μm. The main surface 20b constitutes a fourth main surface in a case where, for example, the main surface 20a constitutes a third main surface.

The protective layer 30 includes a resin layer 31 and a resin layer 33. In the present embodiment, the protective layer 30 is composed of the resin layers 31 and 33. The resin layer 31 is disposed to cover the piezoelectric element body 11 and the external electrode 15. The resin layer 33 is disposed between the external electrode 13 and the vibration member 20 (main surface 20a). The resin layers 31 and 33 are made of an insulating resin. That is, the resin layers 31 and 33 do not contain an electrically conductive filler. The resin layer 31 is formed due to curing a resin material. The resin layer 31 is made of, for example, polyvinyl butyral resin, acrylic resin, or polyurethane resin. In the present embodiment, the resin layer 31 is made of polyvinyl butyral resin. The resin layer 33 is formed due to curing a resin material. The resin layer 33 is made of, for example, thermosetting resin, photocurable resin, or thermosetting and photocurable resin. The resin layer 33 is made of, for example, epoxy resin, acrylic resin, or urethane resin. In the present embodiment, the resin layer 33 is made of acrylic resin. The resin layer 33 constitutes a second resin layer in a case where, for example, the resin layer 31 constitutes a first resin layer.

A hardness of the resin layer 31 is smaller than a hardness of the resin layer 33. The hardness of the resin layer 31 and the hardness of the resin layer 33 are defined by, for example, Shore D (ISO 868). The hardness of the resin layer 31 is, for example, 10 to 30. In the present embodiment, the hardness of the resin layer 31 is 20. The hardness of the resin layer 33 is, for example, 30 to 50. In the present embodiment, the hardness of the resin layer 33 is 45.

The resin layer 31 includes a region 31a overlapping the piezoelectric element body 11 when viewed from the first direction D1 and a region 31b positioned outside the region 31a when viewed from the first direction D1. The region 31b is positioned outside the piezoelectric element body 11 when viewed from the first direction D1 and does not overlap the piezoelectric element body 11. The region 31a covers the external electrode 15 and the region of the main surface 11b exposed from the external electrode 15. The region 31a is in contact with the external electrode 15 and the region of the main surface 11b exposed from the external electrode 15. The region 31b covers the side surface 11c and is in contact with the side surface 11c. In the present embodiment, the region 31b covers a part of the side surface 11c. Specifically, the region 31b covers the region of the side surface 11c near the main surface 11b. The region of the side surface 11c near the main surface 11a is exposed from the region 31b.

As illustrated in FIG. 2, an opening 32 is formed in the region 31a of the resin layer 31. A part of the external electrode 15 is exposed from the opening 32. Therefore, the surface of the external electrode 15 has a region 15a covered with the resin layer 31 (region 31a) and a region 15b exposed from the resin layer 31 (region 31a). The region 15b is positioned to be surrounded by the region 15a when viewed from the first direction D1. An inner edge $31e_1$ of the resin layer 31 (region 31a) defines the region 15b. The inner edge $31e_1$ of the resin layer 31 defines the opening 32. The shape of the region 15b is defined by the shape of the opening 32. In the present embodiment, the region 15b has a substantially circular shape. The piezoelectric element 10 is substantially entirely covered with the protective layer 30 (resin layers 31 and 33) except for the region 15b.

The region 15b is positioned approximately in a middle of the surface of the external electrode 15 when viewed from the first direction D1. Approximately the middle of the surface of the external electrode 15 includes not only a center position of the surface but also a position away from the center position of the surface due to manufacturing error or tolerance. In addition, approximately the middle of the surface of the external electrode 15 includes a position separated by a predetermined minute length from the center of the surface. The predetermined length is, for example, 10% of a radius of the surface of the external electrode 15.

Figure 3:
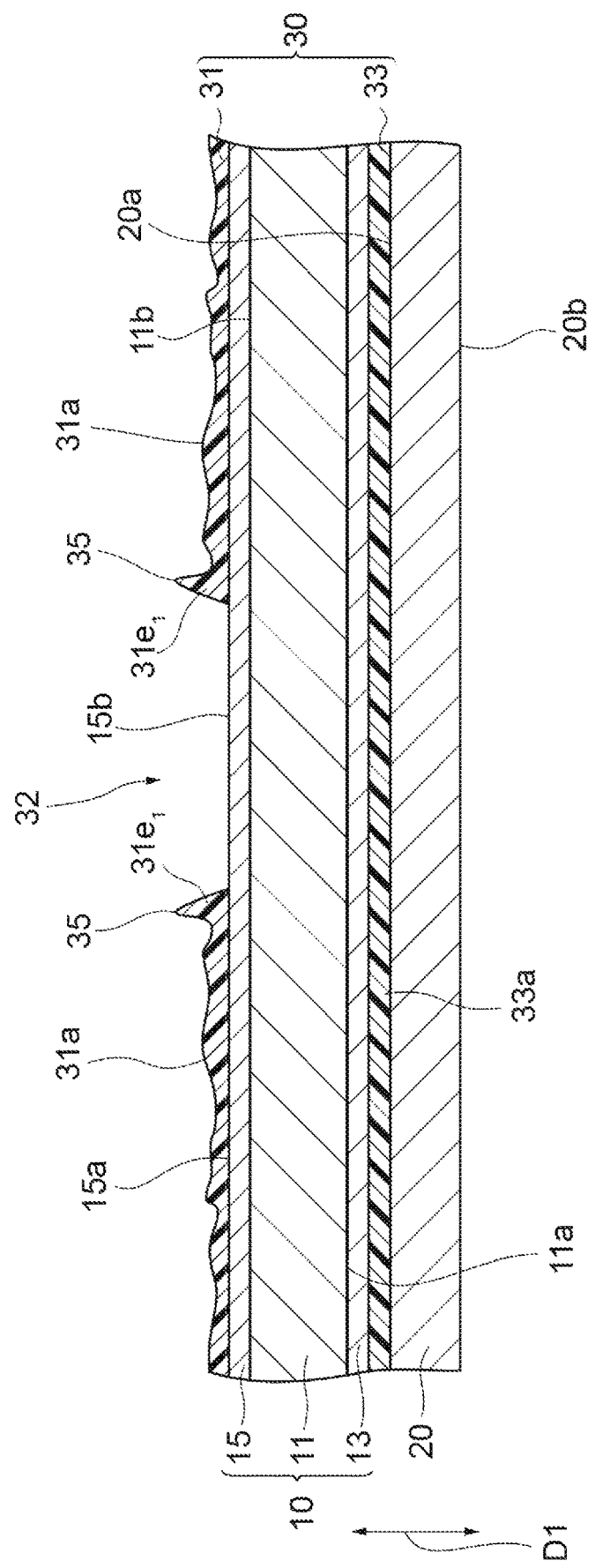
FIG. 3 is a diagram illustrating a cross-sectional configuration of the vibration device according to the present embodiment.

As illustrated in FIG. 3, the resin layer 31 (region 31a) is provided with a protrusion 35 along the inner edge $31e_1$ of the resin layer 31 (region 31a). The protrusion 35 is continuous along the inner edge $31e_1$ (opening 32) of the resin layer 31 when viewed from the first direction D1. The protrusion 35 is continuous along the inner edge $31e_1$ to surround the entire circumference of the opening 32. The protrusion 35 has a substantially annular shape when viewed from the first direction D1. The protrusion 35 protrudes in a direction away from the external electrode 15 (main surface 11b). A distance in the first direction D1 to a top of the protrusion 35 with respect to the surface (region 15a) of the external electrode 15 is larger than a maximum value of a distance in the first direction D1 to the surface of the part of the region 31a other than the protrusion 35. That is, a maximum thickness of the region 31a at the protrusion 35 is larger than the maximum thickness of the region 31a at the part other than the protrusion 35.

The maximum thickness of the region 31a at the protrusion 35 is, for example, 5 to 15 μm. In the present embodiment, the maximum thickness of the region 31a at the protrusion 35 is 10 μm. The maximum thickness of the region 31a at the part other than the protrusion 35 is, for example, 4 to 8 μm. In the present embodiment, the maximum thickness of the region 31a at the part other than the protrusion 35 is 6 μm. An average thickness of the region 31a at the part other than the protrusion 35 is, for example, 3 to 6 μm. In the present embodiment, the average thickness of the region 31a at the part other than the protrusion 35 is 4 μm.

The resin layer 33 joins the piezoelectric element 10 and the vibration member 20. The resin layer 33 joins the external electrode 13 and the main surface 20a of the vibration member 20. The resin layer 33 joins the main surface 11a and the main surface 20a. The piezoelectric element 10 is disposed on the vibration member 20 such that the external electrode 15 and the main surface 20a oppose each other. The external electrode 15 and the main surface 20a oppose each other in a state where the resin layer 33 is present between the external electrode 15 and the main surface 20a. The external electrode 15 and the main surface 20a indirectly oppose each other.

The area of the piezoelectric element 10 (main surfaces 11a and 11b) is smaller than an area of the vibration member 20 (main surfaces 20a and 20b) when viewed from the first direction D1. The piezoelectric element 10 is positioned inside an outer edge of the vibration member 20 (main surface 20a) when viewed from the first direction D1. The piezoelectric element 10 is positioned approximately in the middle of the main surface 20a of the vibration member 20 when viewed from the first direction D1. Approximately the middle of the main surface 20a includes not only a center position of the main surface 20a but also a position away from the center position of the main surface 20a due to manufacturing error or tolerance. In addition, approximately the middle of the main surface 20a includes a position separated by a predetermined minute length from the center of the main surface 20a. The predetermined length is, for example, 5% of a radius of the main surface 20a.

The resin layer 33 includes a region 33a overlapping the piezoelectric element body 11 when viewed from the first direction D1 and a region 33b positioned outside the region 31a when viewed from the first direction D1. The region 33b is positioned outside the piezoelectric element body 11 when viewed from the first direction D1 and does not overlap the piezoelectric element body 11. The region 33a covers the external electrode 13 and the region of the main surface 11a exposed from the external electrode 13. The region 33a is in contact with the external electrode 13 and the region of the main surface 11a exposed from the external electrode 13. The region 33a covers a part of the main surface 20a and is in contact with a part of the main surface 20a. The region 33b covers the side surface 11c and is in contact with the side surface 11c. In the present embodiment, the region 33b covers a part of the side surface 11c. Specifically, the region 33b covers the region of the side surface 11c near the main surface 11a. The side surface 11c is covered with the region 31b and the region 33b. The region 33b covers a part of the main surface 20a and is in contact with a part of the main surface 20a. For example, the region 33b constitutes the outside region that is positioned outside the piezoelectric element 10 when viewed from the first direction D1.

Figure 4:
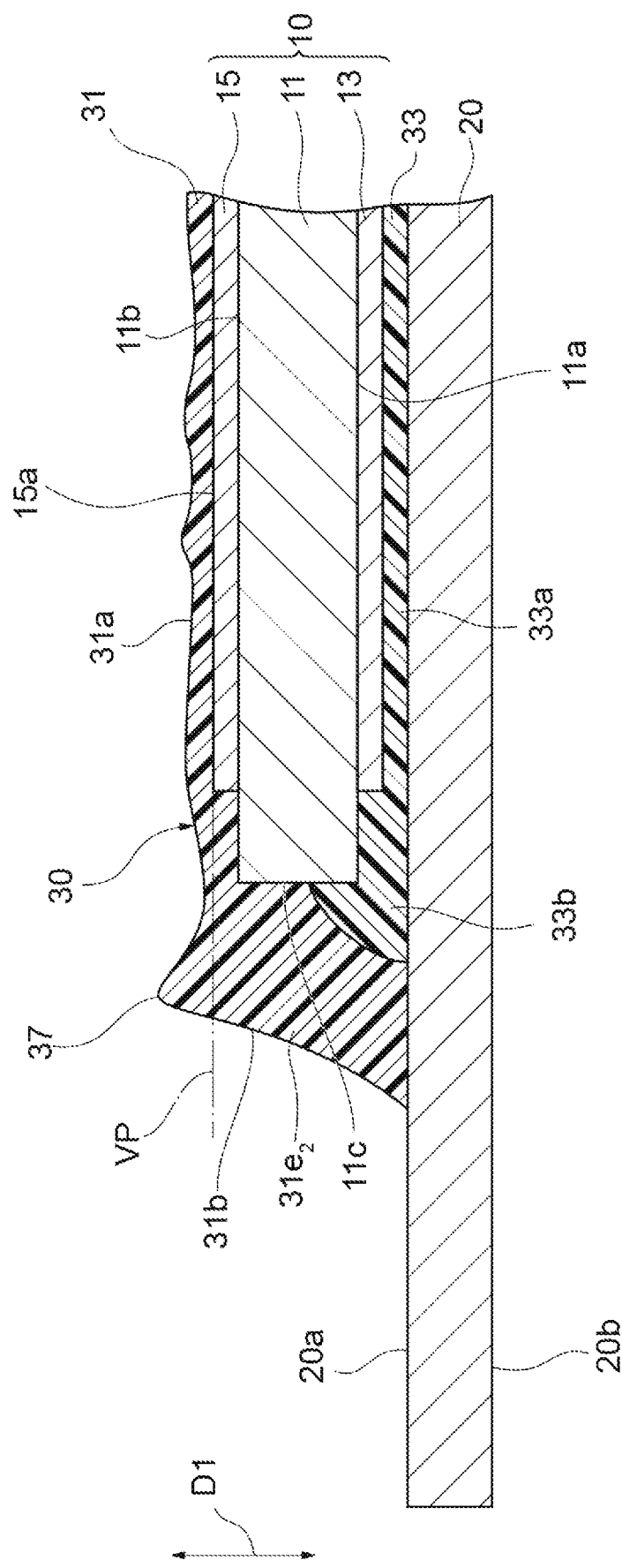
FIG. 4 is a diagram illustrating a cross-sectional configuration of the vibration device according to the present embodiment.

The region 31b overlaps the region 33b when viewed from the first direction D1 and is in contact with the region 33b. The region 33b is covered with the region 31b. The region 31b covers a part of the main surface 20a and is in contact with a part of the main surface 20a. As illustrated in FIG. 4, the region 31b is provided with a protrusion 37 along an outer edge $31e_2$ of the resin layer 31 (region 31b). The protrusion 37 is positioned outside the piezoelectric element 10 when viewed from the first direction D1. The protrusion 37 is continuous along the outer edge $31e_2$ of the resin layer 31 when viewed from the first direction D1. The protrusion 37 has a substantially circular ring shape when viewed from the first direction D1.

The protrusion 37 protrudes in a direction away from a virtual plane VP including the surface of the external electrode 15 (virtual plane including the main surface 11b). The protrusion 37 protrudes in a direction away from the virtual plane including the main surface 11b. The protrusion 37 protrudes in a direction away from the main surface 20a. A distance from the virtual plane VP to a top of the protrusion 37 in the first direction D1 is larger than the maximum value of the distance in the first direction D1 to the surface of the part of the region 31a other than the protrusion 35. In the present embodiment, the thickness of the region 31b is the largest at the position of the top of the protrusion 37.

The distance from the virtual plane VP to the top of the protrusion 37 in the first direction D1 is, for example, 3 to 10 µm. In the present embodiment, the distance from the virtual plane VP to the top of the protrusion 37 in the first direction D1 is 5 µm. The maximum thickness of the region 31b at the protrusion 37 is, for example, 100 to 200 µm. In the present embodiment, the maximum thickness of the region 31b at the protrusion 37 is 160 µm.

Figure 5:
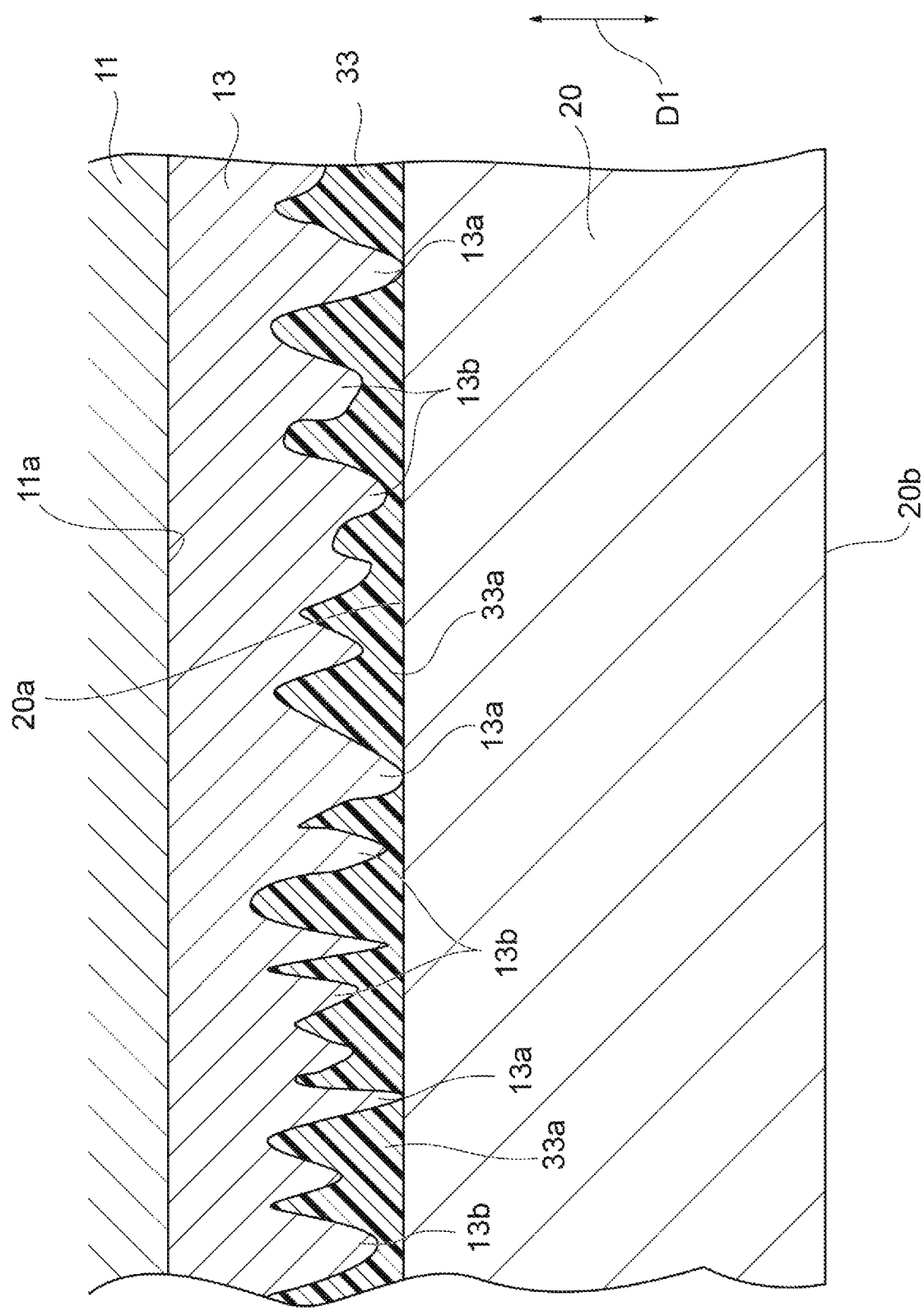
FIG. 5 is a diagram illustrating a cross-sectional configuration of the vibration device according to the present embodiment.

As illustrated in FIG. 5, the external electrode 13 and the main surface 20a are in physical contact with each other and electrically connected to each other. The external electrode 13 includes a plurality of protrusions 13a. The plurality of protrusions 13a are in physical contact with the main surface 20a. The external electrode 13 and the main surface 20a are electrically connected to each other through the plurality of protrusions 13a. Each protrusion 13a constitutes an electrical connection path between the external electrode 13 and the main surface 20a. The main surface 20a is substantially flat. A thickness of the external electrode 13 is the largest at the position of the protrusion 13a. A maximum thickness of the external electrode 13 is, for example, 5 to 10 µm. In the present embodiment, the maximum thickness of the external electrode 13 is 8 µm. A minimum thickness of the external electrode 13 is, for example, 1 to 5 µm. In the present embodiment, the minimum thickness of the external electrode 13 is 2 µm. An average thickness of the external electrode 13 is, for example, 4 to 7 µm. In the present embodiment, the average thickness of the external electrode 13 is 5 µm.

The external electrode 13 also includes a plurality of protrusions 13b that are not in physical contact with the main surface 20a. The plurality of protrusions 13b are separated from the main surface 20a and are not in physical contact with the main surface 20a. Irregular asperity is formed on the surface of the external electrode 13 by the protrusions 13a and 13b. The asperity being irregular includes at least one of an irregular change in top interval in the asperity and an irregular change in height difference in the asperity. Irregular asperity may be formed on the surface of the external electrode 15 as well as the surface of the external electrode 13.

Figure 6:
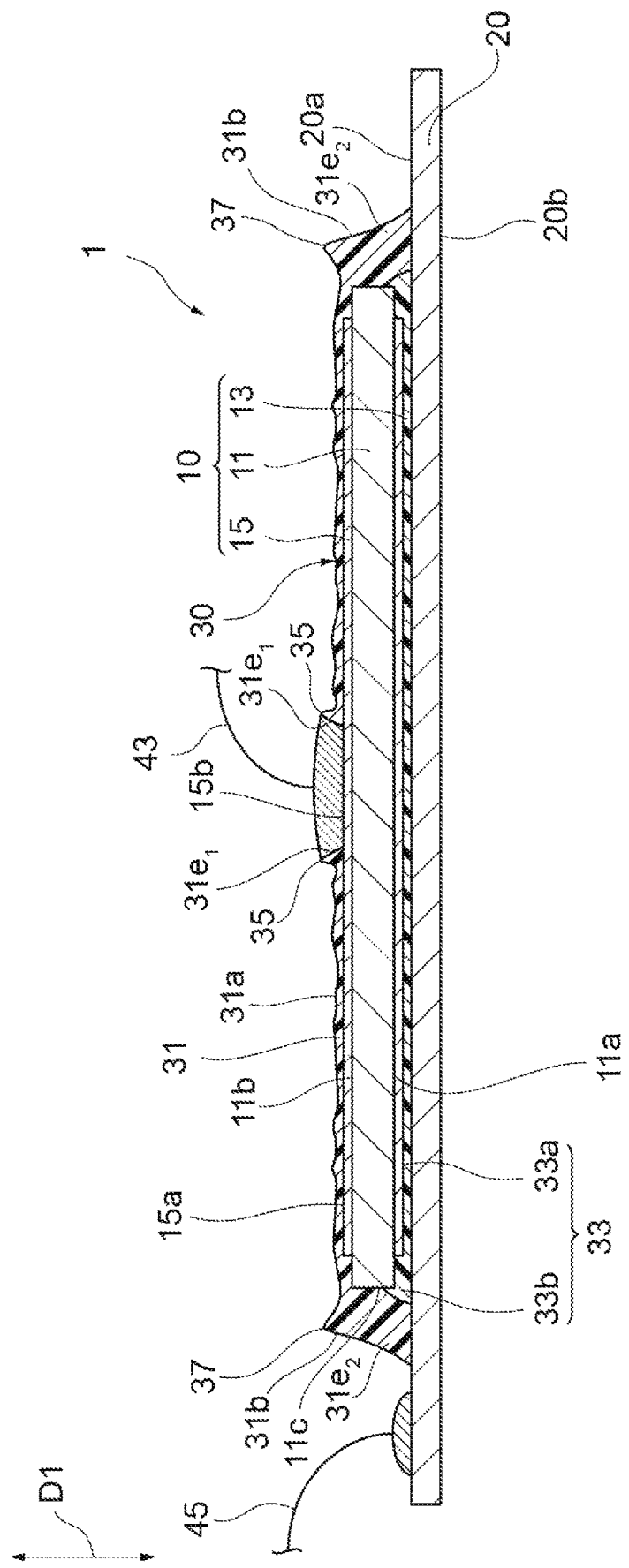
FIG. 6 is a diagram illustrating a cross-sectional configuration of the vibration device according to the present embodiment.

The resin layer 33 is positioned between the plurality of protrusions 13a. The resin layer 33 is positioned between the plurality of protrusions 13b and the main surface 20a in the first direction D1. A thickness of the resin layer 33 varies in correspondence with the shapes of the protrusions 13a and 13b. In FIGS. 3, 4, and 6, the resin layer 33 is illustrated as a layer having a certain thickness for the purpose of simplified illustration.

As illustrated in FIG. 6, a conductor 43 is connected to the external electrode 15 (region 15b) and a conductor 45 is connected to the vibration member 20. The conductor 43 is electrically connected to the external electrode 15. The conductor 45 is electrically connected to the vibration member 20. The conductor 45 is electrically connected to the external electrode 13 through the vibration member 20. A drive voltage is applied to the piezoelectric element 10 through the pair of conductors 43 and 45.

An electric field is generated between the external electrode 13 and the external electrode 15 when voltages having different polarities are applied to the external electrode 13 and the external electrode 15 through the conductors 43 and 45. The region located between the external electrode 13 and the external electrode 15 in the piezoelectric element body 11 forms an active region, and displacement occurs in the active region. When an alternating-current voltage is applied to the external electrodes 13 and 15, the piezoelectric element 10 repeats expansion and contraction in response to a frequency of the applied alternating-current voltage. Since the piezoelectric element 10 and the vibration member 20 are joined to each other, the vibration member 20 performs flexural vibration monolithically with the piezoelectric element 10 in response to repetition of expansion and contraction of the piezoelectric element 10.

As described above, in the present embodiment, the protective layer 30 is disposed to cover the piezoelectric element 10, and thus the protective layer 30 suppresses moisture infiltration into the piezoelectric element body 11. Therefore, the vibration device 1 reduces deterioration of electrical characteristics of the piezoelectric element 10.

In a configuration in which the piezoelectric element 10 is covered with the protective layer 30, the protective layer 30 may hinder displacement of the piezoelectric element 10 and the protective layer 30 may hinder transmission of the displacement from the piezoelectric element 10 to the vibration member 20.

The hardness of the resin layer 31 is smaller than the hardness of the resin layer 33. Therefore, in the vibration device 1, the resin layer 31 tends not to hinder the displacement of the piezoelectric element 10, as compared with in a configuration in which the hardness of the resin layer 31 is equal to or greater than the hardness of the resin layer 33. The hardness of the resin layer 33 is larger than the hardness of the resin layer 31. Therefore, in the vibration device 1, the resin layer 33 tends not to hinder the transmission of the displacement from the piezoelectric element 10 to the vibration member 20, as compared with in a configuration in which the hardness of the resin layer 33 is equal to or less than the hardness of the resin layer 31. Consequently, the protective layer 30 tends not to hinder the displacement of the piezoelectric element 10 and tends not to hinder the transmission of the displacement from the piezoelectric element 10 to the vibration member 20.

In the vibration device 1, the surface of the external electrode 15 includes the region 15a covered with the resin layer 31 and the region 15b exposed from the resin layer 31. In this case, an electrical connection path that reaches the external electrode 15 is realized via the region 15b. Therefore, the vibration device 1 simplifies a configuration realizing the electrical connection path reaching the external electrode 15. The region 15b constitutes a second region in a case where, for example, the region 15a constitutes a first region.

In the vibration device 1, the piezoelectric element 10 is positioned approximately in the middle of the main surface 20a of the vibration member 20 when viewed from the first direction D1. The region 15b is positioned approximately in the middle of the surface of the external electrode 15 when viewed from the first direction D1.

The vibration device 1 may be used in, for example, a press sensor detecting pressing against an operation surface. In a case where the vibration device 1 is used in the press sensor, the vibration device 1 is usually disposed such that approximately the middle of the vibration device 1 in a plan view corresponds to a pressing position on the operation surface. In this case, mainly a portion of the piezoelectric element body 11 that corresponds to the region 15b is displaced and an electric potential attributable to the pressing is generated in the piezoelectric element 10. In the configuration in which the piezoelectric element 10 is positioned approximately in the middle of the main surface 20a and the region 15b is positioned approximately in the middle of the surface of the external electrode 15 when viewed from the first direction D1, the electric potential resulting from the pressing is efficiently taken out through the region 15b. Therefore, the vibration device 1 appropriately detects the pressing.

In the vibration device 1, the region 15b is positioned to be surrounded by the region 15a when viewed from the first direction D1. The resin layer 31 is provided with the protrusion 35 along the inner edge $31e_1$ of the resin layer 31 defining the region 15b.

An electrically conductive paste material may be used for electrical connection between the region 15b and a line of an electronic device equipped with the vibration device 1. In this case, the paste material is applied to the region 15b. In the configuration in which the resin layer 31 is provided with the protrusion 35, the paste material tends to be held in the region 15b, as compared with in a configuration in which the resin layer 31 is not provided with the protrusion 35. Therefore, in the vibration device 1, the region 15b (external electrode 15) is electrically connected to the line of the electronic device in a reliable manner.

In the vibration device 1, the resin layer 31 is provided with the protrusion 37 along the outer edge $31e_2$ of the resin layer 31 at a position outside the piezoelectric element 10 when viewed from the first direction D1. Since the vibration device 1 is provided with the protrusion 37, a thickness of the resin layer 31 at the position outside the piezoelectric element 10 when viewed from the first direction D1 is large, as compared with in a configuration in which the resin layer 31 is not provided with the protrusion 37. Therefore, the resin layer 31 reliably covers the end of the piezoelectric element body 11 and reliably suppresses moisture infiltration into the piezoelectric element body 11.

The configuration in which the thickness of the resin layer 31 is large tends to hinder the displacement of the piezoelectric element 10 as compared with a configuration in which the thickness of the resin layer 31 is small. In contrast, in the vibration device 1, the thickness of the resin layer 31 is large at a position outside the piezoelectric element 10 when viewed from the first direction D1. Therefore, the vibration device 1 tends not to hinder the displacement of the piezoelectric element 10.

In the vibration device 1, the external electrode 13 includes the plurality of protrusions 13a being in physical contact with the main surface 20a. The resin layer 33 is positioned between the plurality of protrusions 13a.

The plurality of protrusions 13a are electrically connected to the main surface 20a by physical contact with the main surface 20a. Therefore, in the vibration device 1, an electrical connection path that reaches the external electrode 13 is reliably realized via the main surface 20a and the plurality of protrusions 13a although the piezoelectric element 10 is covered with the protective layer 30.

The external electrode 13 and the main surface 20a are electrically connected to each other by the physical contact between the external electrode 13 and the main surface 20a. Therefore, in the vibration device 1, the resistance between the external electrode 13 and the main surface 20a is low, as compared with in a configuration in which the external electrode 13 and the main surface 20a are electrically connected to each other through electrically conductive fillers.

The external electrode 13 and the main surface 20a are joined by the resin layer 33 provided between the plurality of protrusions 13a. Therefore, the vibration device 1 ensures bonding strength between the vibration member 20 and the piezoelectric element 10.

The resin layer 33 does not contain an electrically conductive filler. Only the physical contact between the external electrode 13 and the main surface 20a provides the electrical connection between the external electrode 13 and the vibration member 20 (main surface 20a). The resin layer 33 does not contribute to the electrical connection between the external electrode 13 and the vibration member 20. The resin layer 33 has more resin components contained in the same volume and is higher in adhesive strength than a resin layer containing an electrically conductive filler. Therefore, the bonding strength between the vibration member 20 and the piezoelectric element 10 is high in the vibration device 1.

In the vibration device 1, the resin layer 33 includes the region 33b positioned outside the piezoelectric element 10 when viewed from the first direction D1. The resin layer 31 is provided to overlap the region 33b when viewed from the first direction D1 and is in contact with the region 33b. In the vibration device 1, the piezoelectric element 10 is reliably covered with the resin layer 31 and the resin layer 33. Therefore, the resin layer 31 and the resin layer 33 reliably suppress moisture infiltration into the piezoelectric element body 11.

Although the embodiment of the present invention is described above, the present invention is not necessarily limited to the above-described embodiment and various modifications can be made without departing from the scope thereof.

Figure 7:
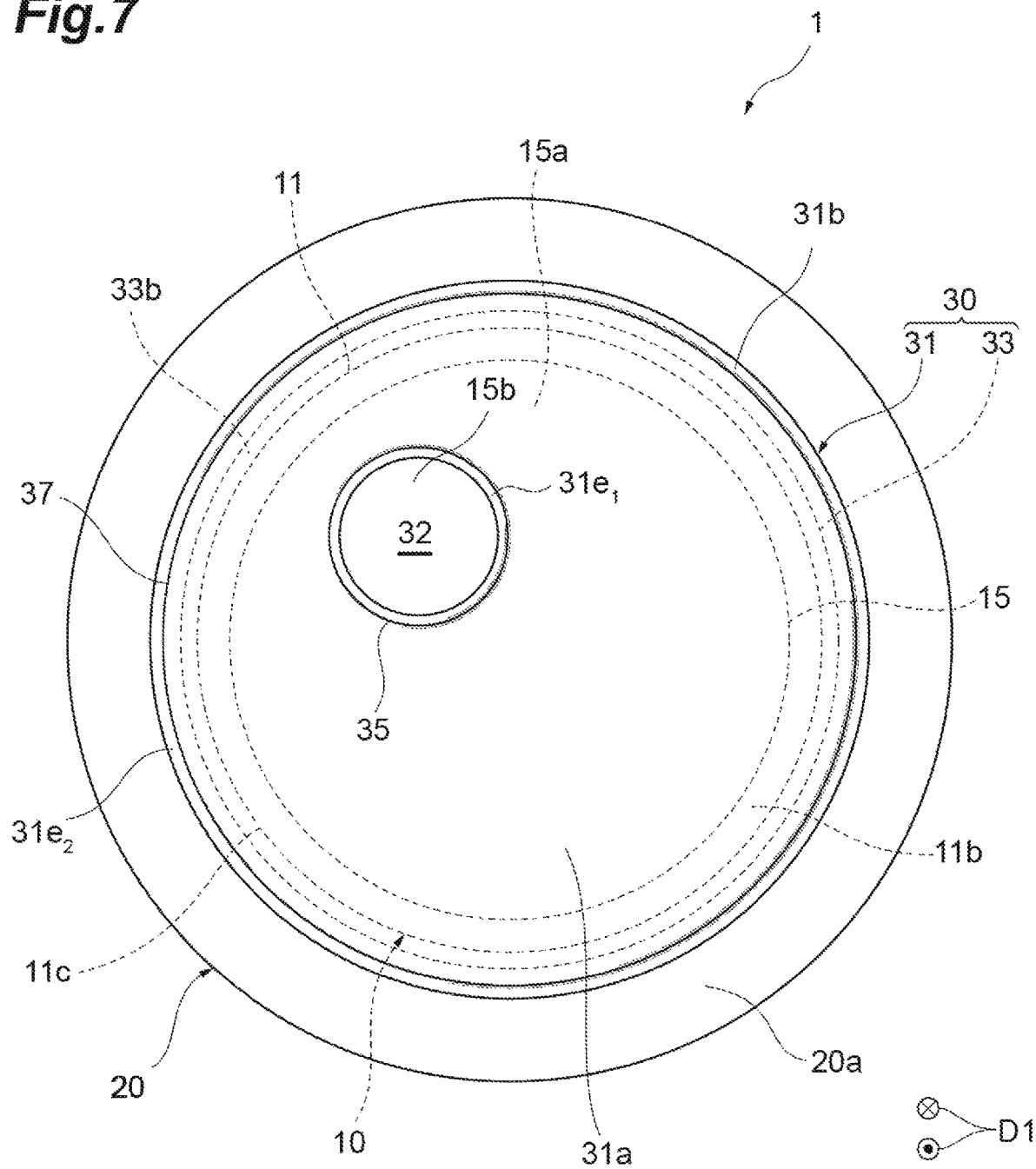
FIG. 7 is a plan view illustrating the vibration device according to a modification example of the present embodiment.

As illustrated in FIG. 7, the region 15b may be separated from approximately the middle of the surface of the external electrode 15 when viewed from the first direction D1.

The opening 32 may not be formed in the resin layer 31. That is, the surface of the external electrode 15 may not include the region 15b. In this case, the resin layer 31 covers substantially the entire surface of the external electrode 15.

Figure 8:
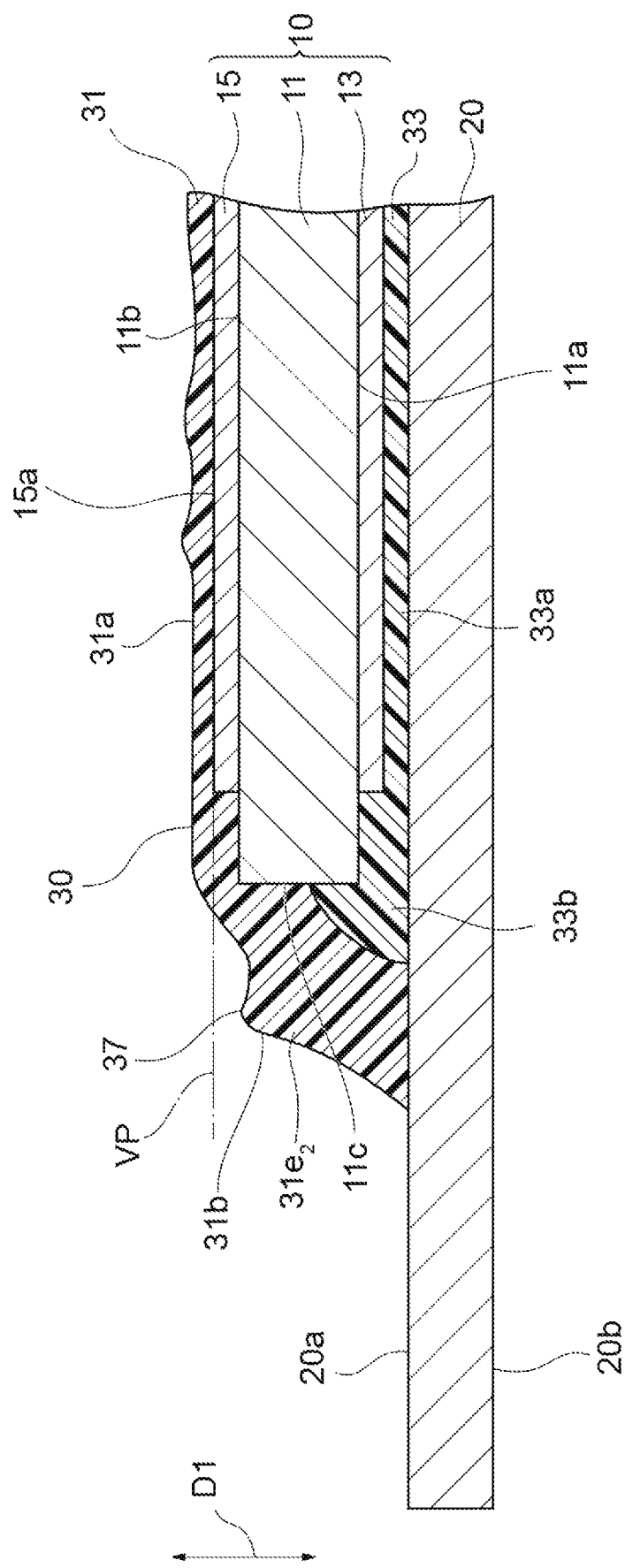
FIG. 8 is a diagram illustrating a cross-sectional configuration of the vibration device according to a modification of the present embodiment.

The protrusion 35 may not be continuous along the inner edge $31e_1$ of the resin layer 31. For example, the protrusion 35 may be provided intermittently along the inner edge $31e_1$. The protrusion 37 may not be continuous along the outer edge $31e_2$ of the resin layer 31. For example, the protrusion 37 may be provided intermittently along the outer edge $31e_2$. The top of the protrusion 37 may be positioned between the virtual plane VP and the main surface 20a as illustrated in FIG. 8.

Figure 9:
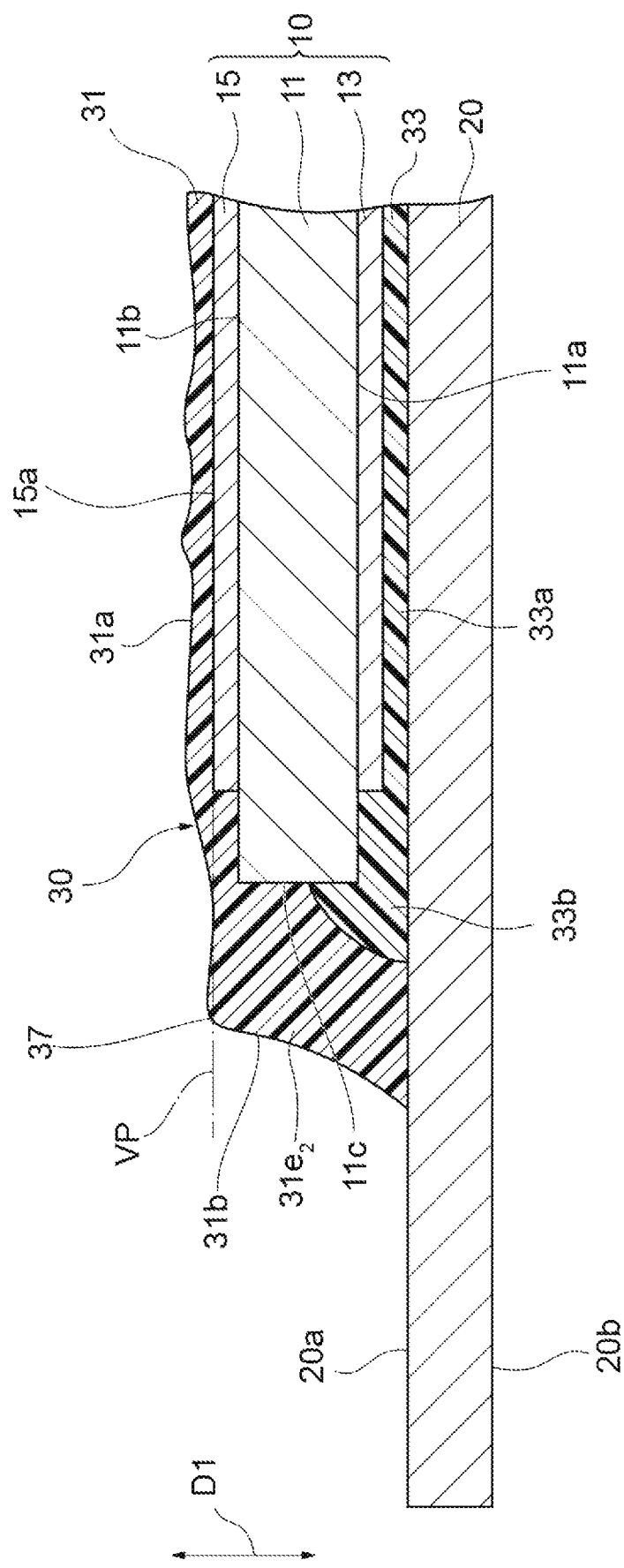
FIG. 9 is a diagram illustrating a cross-sectional configuration of the vibration device according to a modification of the present embodiment.

The resin layer 31 may not be provided with the protrusion 37 as illustrated in FIG. 9. The resin layer 31 may not be provided with the protrusion 35.

Although the side surface 11c of the piezoelectric element body 11 is covered with the resin layer 31 (region 31b) and the resin layer 33, the configuration in which the protective layer 30 covers the side surface 11c is not limited thereto. The resin layer 31 (region 31b) alone may cover the side surface 11c of the piezoelectric element body 11. The resin layer 33 alone may cover the side surface 11c of the piezoelectric element body 11.

Although the resin layer 31 (region 31b) is in contact with the resin layer 33 (region 33b) and the main surface 20a of the vibration member 20, the configuration of the resin layer 31 (region 31b) is not limited thereto. The resin layer 31 (region 31b) may be in contact with only the resin layer 33 (region 33b).

The resin layer 33 may not include the region 33b. In this case, the resin layer 31 (region 31b) is in contact with the region 33a.

Although the protective layer 30 includes the two resin layers 31 and 33, the protective layer may include another resin layer. In this case, the protective layer 30 may have the following configuration. The resin layer 31 is disposed to cover the external electrode 15 and the region of the main surface 11b exposed from the external electrode 15. The resin layer 33 is disposed to cover the external electrode 13 and the region of the main surface 11a exposed from the external electrode 13. The other resin layer is disposed to cover the entire side surface 11c. A hardness of the other resin layer may be smaller than the hardness of the resin layer 33. The hardness of the other resin layer may be equivalent to the hardness of the resin layer 31 or may be different from the hardness of the resin layer 31.

The shapes of the piezoelectric element body 11, the external electrodes 13 and 15, and the vibration member 20 are not limited to the shapes described above. For example, the piezoelectric element body 11, the external electrodes 13 and 15, and the vibration member 20 may have a polygonal shape in a plan view.

The piezoelectric element 10 may include one or more internal electrodes disposed in the piezoelectric element body 11. In this case, the piezoelectric element body 11 may include a plurality of piezoelectric layers and the internal electrodes and the piezoelectric layers may be disposed alternately.

A plurality of pores may be distributed in the resin layer 31. A plurality of pores may also be distributed in the resin layer 33.

The resin layer 33 may contain a conductive filler. In this case, the external electrode 13 and the main surface 20a may not be in direct physical contact with each other.

The vibration member 20 may be, for example, a housing of an electronic device. The vibration member 20 may be, for example, a member different from the housing of the electronic device. In this case, the vibration member 20 may be attached to the housing by surface adhesion.

The vibration member 20 may include a substrate having an electrical insulation property and a conductive layer disposed on a surface of the substrate. In this case, a surface of the conductive layer constitutes the main surface 20a.

REFERENCE SIGNS LIST

1: vibration device, 10: piezoelectric element, 11: piezoelectric element body, 11a, 11b: main surface of piezoelectric element body, 13, 15: external electrode, 13a: protrusion, 15a, 15b: region of surface of external electrode, 20: vibration member, 20a, 20b: main surface of vibration member, 30: protective layer, 31: resin layer, $31e_1$: inner edge, $31e_2$: outer edge, 33: resin layer, 35, 37: protrusion, D1: first direction.

The invention claimed is:

1. A vibration device comprising:
a piezoelectric element including a piezoelectric element body having a first main surface and a second main surface opposing each other, a first external electrode disposed on the first main surface, and a second external electrode disposed on the second main surface;
a vibration member including an electrically conductive third main surface and a fourth main surface opposing the third main surface and disposed such that the third main surface opposes the first external electrode; and
a protective layer disposed to cover the piezoelectric element, wherein
the first external electrode and the third main surface are electrically connected to each other,
the protective layer includes a first resin layer disposed to cover the piezoelectric element body and the second external electrode, and a second resin layer disposed between the first external electrode and the third main surface and joining the first external electrode and the third main surface, and
the first resin layer is smaller in hardness than the second resin layer.

2. The vibration device according to claim 1, wherein a surface of the second external electrode includes a first region covered with the first resin layer and a second region exposed from the first resin layer.

3. The vibration device according to claim 2, wherein the piezoelectric element is positioned approximately in a middle of the third main surface of the vibration member when viewed from a direction orthogonal to the second main surface, and
the second region is positioned approximately in a middle of the surface of the second external electrode when viewed from the direction orthogonal to the second main surface.

4. The vibration device according to claim 2, wherein the second region is positioned to be surrounded by the first region when viewed from a direction orthogonal to the second main surface, and
the first resin layer is provided with a protrusion along an inner edge of the first resin layer defining the second region.

5. The vibration device according to claim 1, wherein the first resin layer is provided with a protrusion along an outer edge of the first resin layer at a position outside the piezoelectric element when viewed from a direction orthogonal to the second main surface.

6. The vibration device according to claim 1, wherein the first external electrode includes a plurality of protrusions being in physical contact with the third main surface, and
the second resin layer is positioned between the plurality of protrusions of the first external electrode.

7. The vibration device according to claim 1, wherein the second resin layer includes an outside region positioned outside the piezoelectric element when viewed from a direction orthogonal to the second main surface, and
the first resin layer is provided to overlap the outside region of the second resin layer when viewed from the direction orthogonal to the second main surface and is in contact with the outside region of the second resin layer.

* * * * *